United States Patent [19]
Cawlfield

[11] Patent Number: 5,246,025
[45] Date of Patent: Sep. 21, 1993

[54] CONTROLLED FLUID AGITATION METHOD AND APPARATUS

[76] Inventor: B. Gene Cawlfield, 3322 Latham Dr., Dallas, Tex. 75229

[21] Appl. No.: 676,272

[22] Filed: Mar. 28, 1991

[51] Int. Cl.$^5$ .............................................. B08B 3/04
[52] U.S. Cl. .............................. 134/102.2; 134/103.1; 134/201; 134/902
[58] Field of Search ............... 134/34, 36, 94, 102, 134/104.4, 103, 111, 22.12, 201, 902; 68/185

[56] References Cited

U.S. PATENT DOCUMENTS

| Re. 19,697 | 9/1935 | Kjellgren | 23/1 |
|---|---|---|---|
| Re. 19,698 | 9/1935 | Kjellgren | 23/1 |
| 1,983,931 | 12/1934 | Carter | 134/34 |
| 2,519,654 | 8/1950 | Heaney | 134/103 |
| 2,967,120 | 1/1961 | Chaney | 134/103 |
| 3,033,712 | 5/1962 | Brevik | 134/34 |
| 3,441,035 | 4/1969 | Edwards | 134/103 |
| 3,544,074 | 6/1970 | Karpacheva et al. | 259/1 |
| 3,608,866 | 9/1971 | Karpacheva et al. | 259/1 |
| 3,673,944 | 7/1972 | Maxwell | 95/89 R |
| 3,705,544 | 12/1972 | Ratowsky | 95/93 |
| 3,831,905 | 8/1974 | Htoo et al. | 259/4 |
| 3,923,072 | 12/1975 | Beaud | 134/103 X |
| 4,111,715 | 9/1978 | Sprengling et al. | 134/103 X |
| 4,141,312 | 2/1979 | Louder et al. | 134/103 X |
| 4,483,270 | 11/1984 | Toya et al. | 134/103 X |
| 4,722,752 | 2/1988 | Steck | 134/25.4 |

FOREIGN PATENT DOCUMENTS

| 504541 | 4/1971 | Switzerland | 134/103 |
|---|---|---|---|
| 1382507 | 3/1988 | U.S.S.R. | 134/102 |
| 1532952 | 9/1978 | United Kingdom | 134/102 |

*Primary Examiner*—Frankie L. Stinson
*Attorney, Agent, or Firm*—Daniel Rubin

[57] ABSTRACT

Method and apparatus is disclosed for displacing a process fluid to effect agitation thereof in a laminar flow relation past a work piece being treated by the fluid. Where the process fluid comprises a liquid, a logic circuit is operative to oscillate the liquid by raising and lowering the liquid level about the work piece in a controlled cycle and stroke. Where the process fluid comprises a gas, the process gas is displaced or compressed and decompressed about the work piece in a controlled operating cycle. Various embodiments are disclosed for varying the operating parameters.

24 Claims, 5 Drawing Sheets

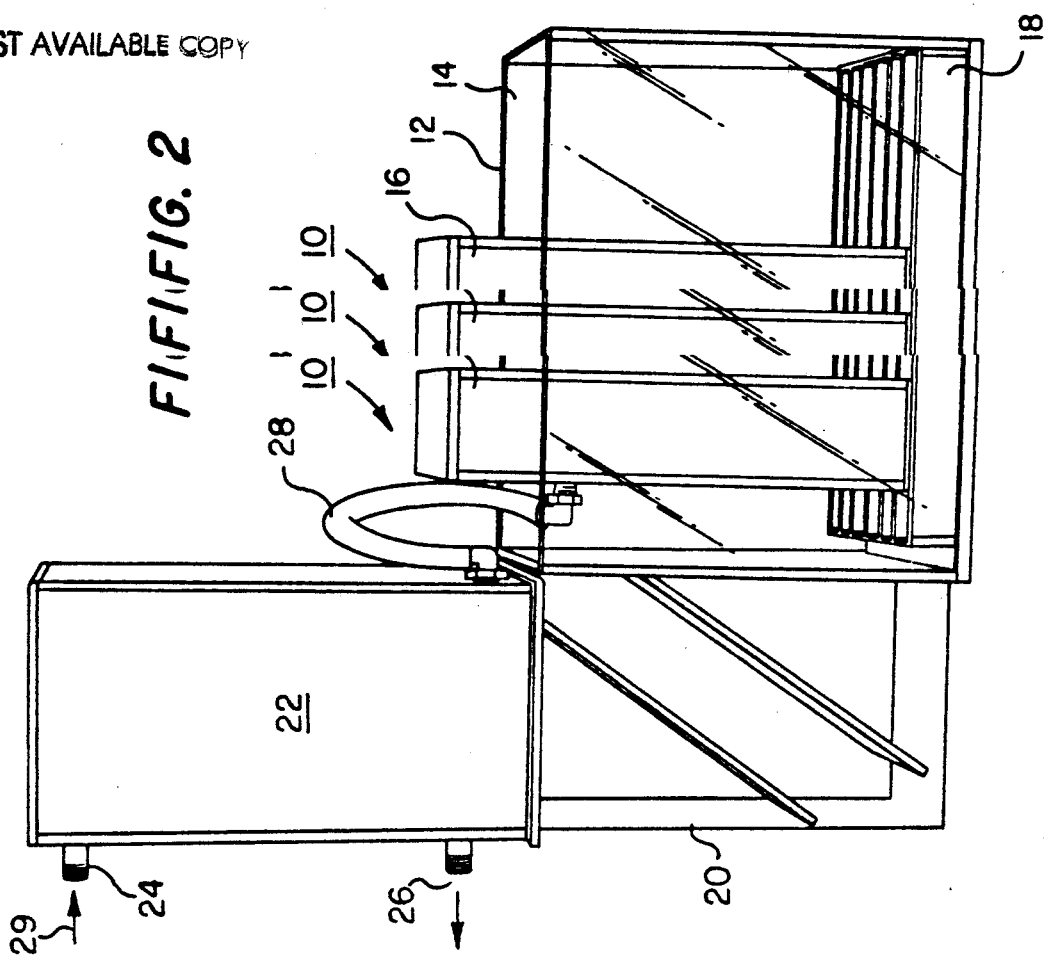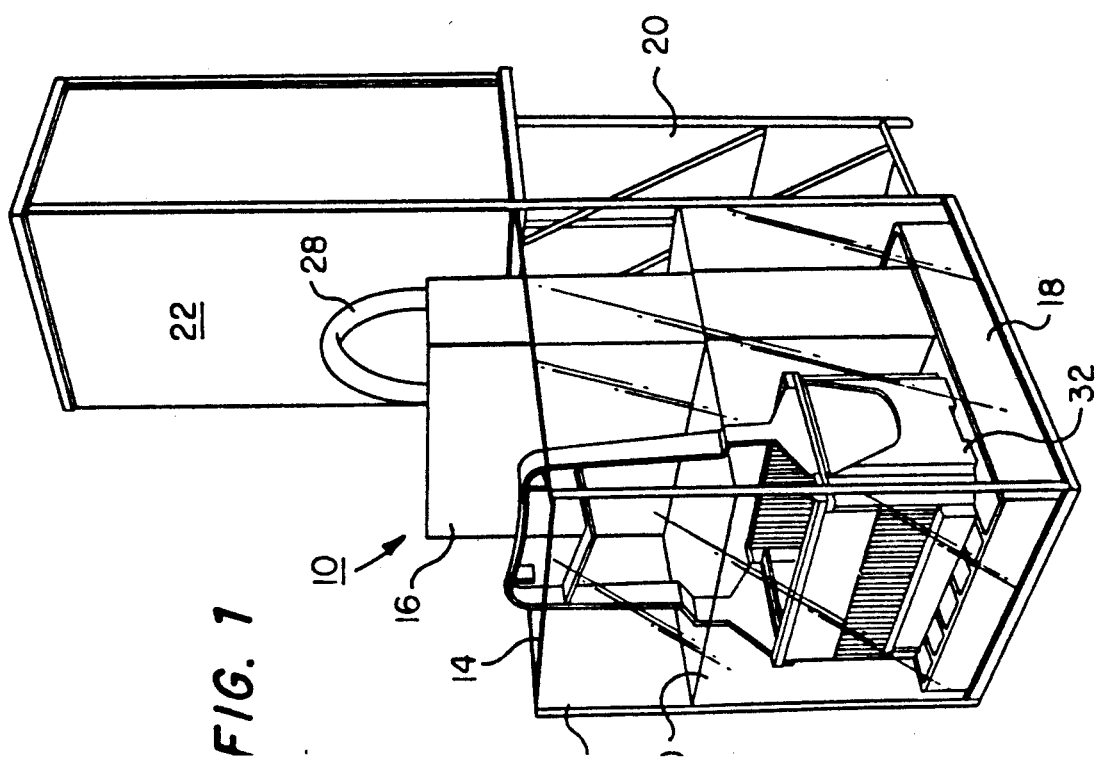

CONTROLLED FLUID AGITATION METHOD AND APPARATUS

FIELD OF INVENTION

The field of art to which the invention relates comprises the art of controlling flow of a processing fluid in relation to a work piece responsive to fluid contact.

BACKGROUND OF THE INVENTION

It is a common industrial practice to utilize a processing fluid for effecting surface treatment of a work piece with which the fluid is in contact. Well known applications in which such a fluid is used include by way of example photoresist, developing, etching, cleaning; electroplating; electroless plating; coating; photographic developing, cleaning, etc.

BACKGROUND OF THE PRIOR ART

When using process fluid, either liquid or gas, in the treatment of a work piece, it is desirable if not essential to continually or continuously provide fresh fluid to the treated surface in order to optimize the chemical result sought to be achieved Failure to adequately provide fresh fluid on that basis can readily reduce the operative effectiveness of the fluid resulting from contamination, dilution, consumption, etc. Various structures generally utilized for providing fresh fluid under those circumstances have typically comprised a tank of sorts in which the work piece is placed. A continuous flow of the process fluid is then passed in turbulent contact with the work piece whereby the presenting fluid is ordinarily "fresher" than the spent fluid. Exemplifying the latter has been the use of bubble streams, bubble lifts, bubble curtains, rotary stirrers, fans, recirculating pumps, regulated flow, plungers, etc.

While the foregoing approaches have functioned reasonably well, it has not heretofore been known how providing fresh fluid in such prior process fluid flow to a work piece surface could be improved upon.

OBJECTS OF THE INVENTION

It is an object of the invention to provide novel method and apparatus for effecting enhanced presentation of fresh process fluid to the surface of a work piece being treated.

It is a further object of the invention to effect the previous object by controllably managing the agitation of the fluid in relation to the surface of the work piece being treated.

It is still a further object of the invention to effect the previous objects with a laminar fluid flow effected by controlled flow oscillation of the process fluid.

SUMMARY OF THE INVENTION

This invention relates to novel method and apparatus for controlling the flow of process fluid in passing contact with the surface of a work piece being treated. More specifically, the invention relates to a controlled fluid flow that is continuously agitated for repetitively delivering fresh fluid against the treated surface. The fluid can be either liquid or gas.

The foregoing is achieved in accordance with the invention by the apparatus hereof causing the process fluid to be oscillated about the work piece in a controlled cycle and stroke. An exemplary embodiment in which the process fluid is liquid, comprises a two compartment tank of which one compartment is generally open and is adapted to receive the work piece in an immersed relation within the process fluid. A second compartment is juxtaposed and in flow communication with the first compartment and is generally enclosed and pressure tight at and above the fluid level to define an air cylinder thereat. When inoperative, the liquid levels in the two compartments are equal. By introducing quantities of an operating gas under pressure via a logic circuit in communication with the air cylinder, the cylinder is operative as an air piston causing the process liquid level in the second compartment to drop. Simultaneously, the liquid level in the first compartment is caused to rise in a laminar flow relation past the work piece. On subsequently removing or exhausting the operating gas from the air cylinder, the risen liquid level will fall reverting to equal levels between compartments. By the logic circuit alternating the rise and fall of the process fluid past the work piece in a controlled oscillating cycle of stroke and rate, each rise and fall of the process fluid causes the fluid to be controllably agitated. From the fluid agitation produced thereby, fresh fluid is continuously caused to be delivered against the work piece.

The overall effect of the above is to increase efficiency of the process yet operation is achieved with the most simplistic of apparatus consisting generally of only a tank connected to a control unit in turn connected to a source of pressurized operating fluid. Various embodiments of the foregoing are disclosed. The apparatus per se is functional without moving parts in the process region and does not normally cause work piece displacement in the course of raising and lowering the fluid level. Instead, only the process fluid is caused to be displaced in a fluid oscillation cycle resulting from an injected operating fluid under pressure functioning as a gas piston. The process fluid is caused to oscillate vertically in a process column within the first compartment from the reciprocal forced gas piston displacement in the second compartment and from which fresh fluid agitation occurs.

Despite the simplicity of the system, the induced agitation achieves an increased efficiency of the treatment effected between the process fluid and the work piece by virtue of the increasingly delivered fresh fluid available at the work surface. This is attributed to a much higher equivalent flow volume than would normally be obtained with a prior art system utilizing, for example, a recirculation pump and generating turbulent flow.

The above noted features and advantages of the invention as well as other superior aspects thereof will be further appreciated by those skilled in the art upon reading the detailed description which follows in conjunction with the drawings.

BRIEF DESCRIPTION OF THE DRAWINGS

FIG. 1 is an isometric side view of an apparatus embodiment of the invention;

FIG. 2 is a side elevation of the apparatus of FIG. 1;

DESCRIPTION OF THE PREFERRED EMBODIMENT

Figure 3A:
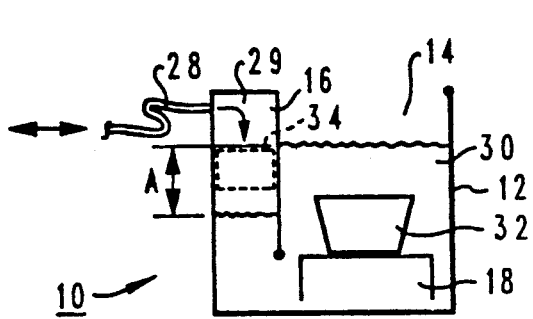
FIGS. 3 (a), (b), and (c) are schematic illustrations of different embodiments utilizing a liquid process fluid subject to a gas piston action.

In the description which follows, like parts are marked throughout the specification and drawings with the same reference numerals respectively. The drawings figures are not necessarily to scale and in certain views parts may have been exaggerated for purposes of clarity.

Referring now to FIGS. 1 and 2 of the drawings, there is illustrated an apparatus embodiment designated 10 and comprised of a tank 12 divided between an open compartment 14 and a upright generally enclosed sealed tight compartment 16. At their underside, the compartments are in flow communication with each other via a slotted base 18. Behind tank 12 is a stand 20 supporting a control cabinet 22 containing control logic as will be described. Briefly, an operating fluid 29 under pressure, usually a gas such as air, is supplied via the logic to inlet 24 and is exhausted at outlet 26. A flexible or rigid conduit 28 secured between cabinet 22 and the upper interior air cylinder portion of tank compartment 16 operates to transmit and receive the operating fluid 29 to and from compartment 16 as will be understood.

Within both tank compartments is a quantity of process liquid 30 of height sufficient to immerse a work product exposed within a removable tray 32 supported on base 18. When the apparatus is inoperative, the liquid is uniformly level in both tank compartments and extends a predetermined height above a work piece in the tray. The established height should enable a predetermined rise and fall of the liquid level in tank compartment 14 without dipping below the level of the work pieces in tray 32 With compartment 16 being generally sealed and pressure tight above the fluid level, a piston cylinder is internally defined thereat. By virtue of such piston, operating fluid 29 when introduced by conduit 28 will operate in the manner of a pneumatic piston forcing a level height differential "A" (FIG. 3) between the compartments 14 and 16.

In the embodiment of FIG. 3(a), the process fluid 30 is a liquid and the operating fluid 29 contained in conduit 28 is a gas. As can be seen, introducing the gas 29 into the upper chamber of compartment 16 causes the liquid level in compartment 16 to fall and the liquid level in compartment 14 to rise for producing the differential height level "A". After achieving the intended height differential, the operating fluid in compartment 16 will be exhausted back through conduit 28 and exhaust outlet 26. This then permits equalization of the liquid levels between compartments to be restored.

By maintaining a controlled oscillating cycle of raising and lowering the level in compartment 14 over a predetermined cycle rate and stroke, the fluid incurs a laminar flow in the course of producing desired fluid agitation. The effect is to continually deliver fresh fluid in contact with the work piece (not shown) disposed in removable tray 32. Optionally, where the possibility of leakage or other deleterious effect exists in the upper chamber of compartment 16, a bladder 34 shown in phantom could be utilized to expand and contract for controllably varying the liquid level in compartment 16.

Figure 3B:
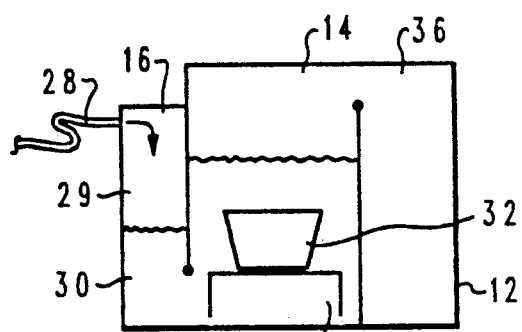
Figure 3C:
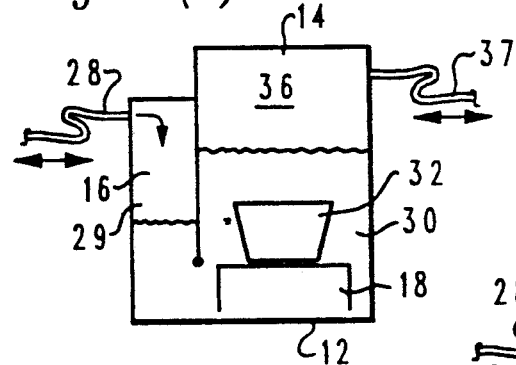

For the apparatus variation of FIG. 3(b), both compartments 14 and 16 are enclosed such that a confined volume of air or other gas 36 extends over and about the liquid level in compartment 14. The latter gas is caused to be compressed and decompress(R)d as pressurized gas flow 29 is introduced and exhausted through conduit 28. The specific effect thereof is that the gas 36 in the course of being compressed and expanded functions as an air spring so as to slow the rise rate of liquid 30 and accelerate the fall rate of liquid 30 in compartment 14.

For the embodiment variation 3(c), a second conduit 37 communicates with gas 36 in compartment 14 similarly to gas 29 in conduit 28. In this arrangement, each of gases 29 and 36 are supplied and exhausted into their respective conduits 28 and 37 and are conducted via the logic in a timed phase relation to each other. Preferably, the phase relation is opposite so as to increase the rate of oscillation. This embodiment therefore constitutes a further refinement in controlling the oscillating rate of the rise and fall of the liquid level in compartment 14.

Figure 4A:
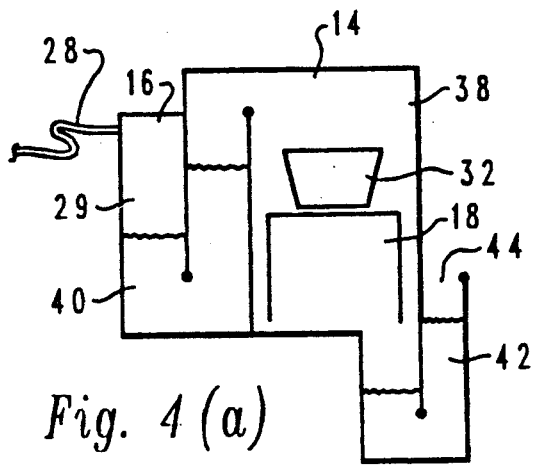
FIGS. 4 (a), (b), and (c) are schematic illustrations with different embodiments utilizing a gas process fluid subject to a gas piston action.

With reference to FIG. 4(a), the process fluid 38 comprises a gas that is confined between two liquid pockets 40 and 42, the latter of which is in communication with an open compartment 44. Deliverance of operating fluid 29 through conduit 28 causes a displacement of the process gas 38 by forcing a raised level of liquid 40 toward compartment 14 and a reduced level of liquid 42 at the underside of compartment 14.

Figure 4B:
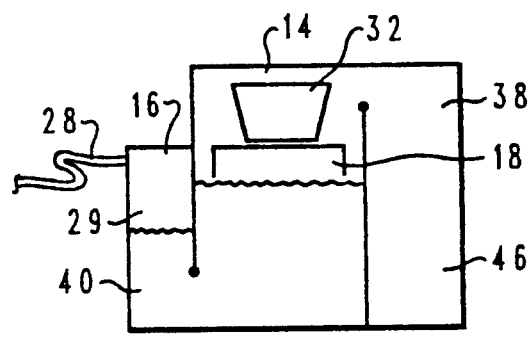

In the variation embodiment of FIG. 4(b), the process gas 38 is caused to incur compression and decompression as the level of liquid 40 in compartment 14 is raised and lowered. In this manner, the process fluid 38 is also caused to function as an air spring in opposition to the force of fluid 40 for incurring oscillating displacement of gas 38 with respect to the work piece in tray 32.

Figure 4C:
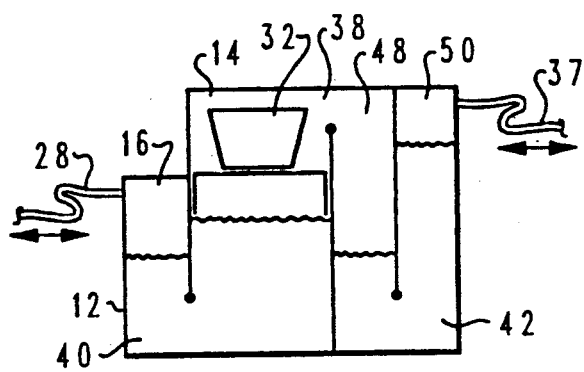

In the embodiment variation of FIG. 4(c), there is included secondary compartments 48 and 50 similarly sealed and enclosed in the manner of compartments 14 and 16 of FIG. 4 (b). Like the previous embodiment, the process fluid 38 comprises a gas contained within a confined volume between liquids 40 and 42. Conduit 28 communicates with compartment 16 while separate conduit 37 communicates with compartment 50 for varying the respective liquid levels in a manner analogous to that described in connection with FIG. 3(c). A typical application for this arrangement could comprise a work piece in tray 32 having deep textured surfaces. Faster gas agitation can promote the reaction rate and completion in surface recesses.

Figure 5:
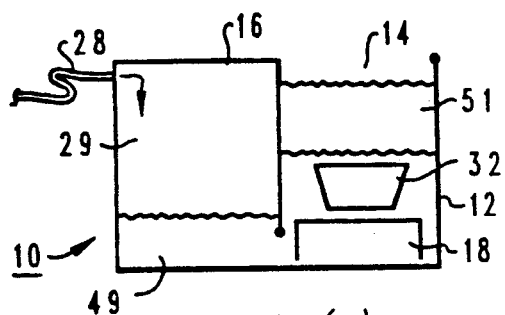
FIGS. 5 (a) and (b), are schematic illustrations of a different embodiment utilizing multiple process liquids subject to a gas piston action.
Figure 5:
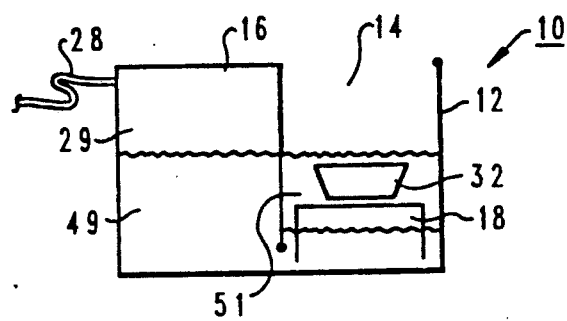

Referring now to FIGS. 5(a) and 5(b), there is illustrated an embodiment comprising two immiscible processing liquids 49 and 51 of the same or different densities for sequentially effecting staged processing of the work pieces in tray 32. Without operating gas 29 being supplied through conduit 28 and for liquids of the same density, the level of liquid 49 in compartment 16 is equal to the level of liquid 51 in compartment 14. At that time, the work piece in tray 32 is entirely immersed in the liquid 51 as seen in FIG. 5 (a). At such time as pressure of gas 29 is supplied through conduit 28, the liquid levels in compartment 14 are forced to rise until the work piece is entirely immersed in liquid 49 as seen in FIG. 5 (b). By way of example, the liquids 49 and 51 could comprise a first liquid which is reactive and the other which is non-reactive but produces intermittent cooling. Moreover, fluid 51 could comprise a gas rather than being a liquid as stated and the process described could involve two separate reactions in sequence.

Figure 6:
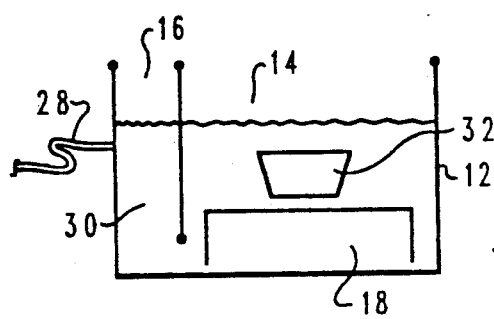
FIG. 6 is a schematic illustration of an embodiment utilizing a liquid process fluid and a liquid operating fluid.

For the embodiment of FIG. 6, both the process fluid and the operating fluid are liquid. The process fluid 30 is per se bidirectionally communicated via conduit 28 to compartment 16 below the lowest contemplated level of liquid 30 therein. In this arrangement, the liquid levels of fluid 30 in compartments 14 and 16 rise and fall in unison.

Figure 7:
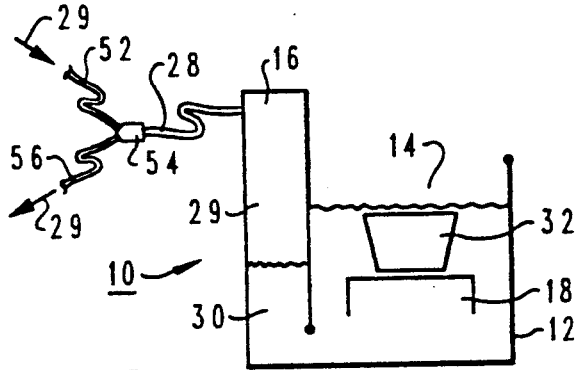
FIG. 7 is a schematic illustration of still another embodiment providing a push-pull gas piston action.

In the embodiment of FIG. 7, the construction of tank 12 is similar to that of FIG. 3(a) described supra and differs in operation in that the pressurized operating gas 29 is first delivered through a conduit 52 and then through a two way valve 54 before entering conduit 28. At such time as gas 29 is to be exhausted, valve 54 is switched via logic to connect conduit 28 to a conduit 56 connected in turn to a source of vacuum (not shown). The advantage of this specific embodiment is the increased exhaust rate that can be achieved to effect leveling of the liquids in compartments 14 and 16.

Figure 8:
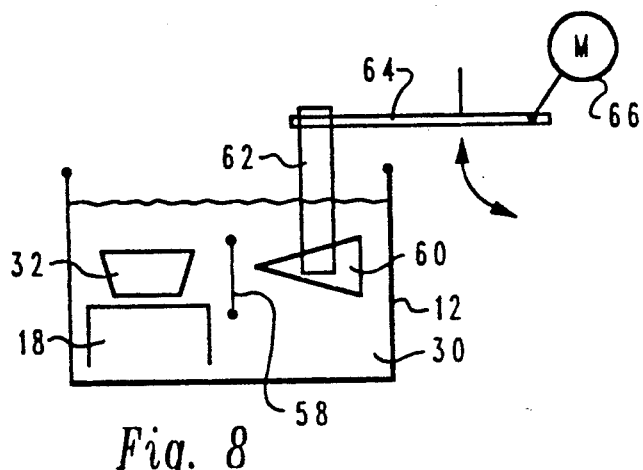
FIG. 8 is a schematic illustration with a still further embodiment utilizing a mechanical drive for effecting oscillation of the process fluid.

For the embodiment of FIG. 8, tank 12 is not separated into compartments in the manner of the previous embodiments but instead includes a vertical intermediate divider partition 58. The portion left of the partition includes a shelf 18 on which the tray 32 containing the various work pieces to be processed is supported. Immersed in the process fluid 30 within the rightward portion of the tank is an enlarged wedge 60 supported at the distal lower end of dependent arm 62 oppositely joined to a crank arm 64. The arm 64 is driven in an oscillating motion via motor 66. Unlike the previous embodiments in which a pressurized operating fluid is utilized to vary the liquid level of the processing liquid 30, this embodiment utilizes a mechanical drive causing wedge 60 to vertically oscillate and in turn generate an oscillating flow of the process liquid past the work pieces in tray 32.

Figure 9:
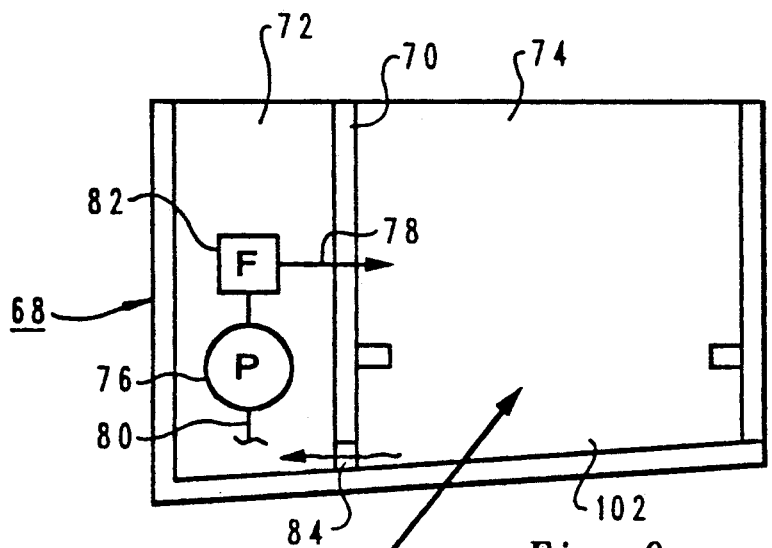
FIG. 9 is a sectional elevation through another form of the apparatus embodiment.

A preferred embodiment is disclosed in FIGS. 9, 10, and 11 as will now be described. This embodiment is comprised of a basic tank housing designated 68 including an intermediate divider 70 defining a first compartment 72 and a larger second compartment 74. Within compartment 72 is contained a recirculating pump 76 for discharging process fluid 30 through filter 82 and into conduit 78 while return process fluid is received from sump 102 via conduit 80. The underside of divider 70 includes a plurality of longitudinally spaced apertures 84 through which the process fluid is returned to intake conduit 80.

Figure 10:
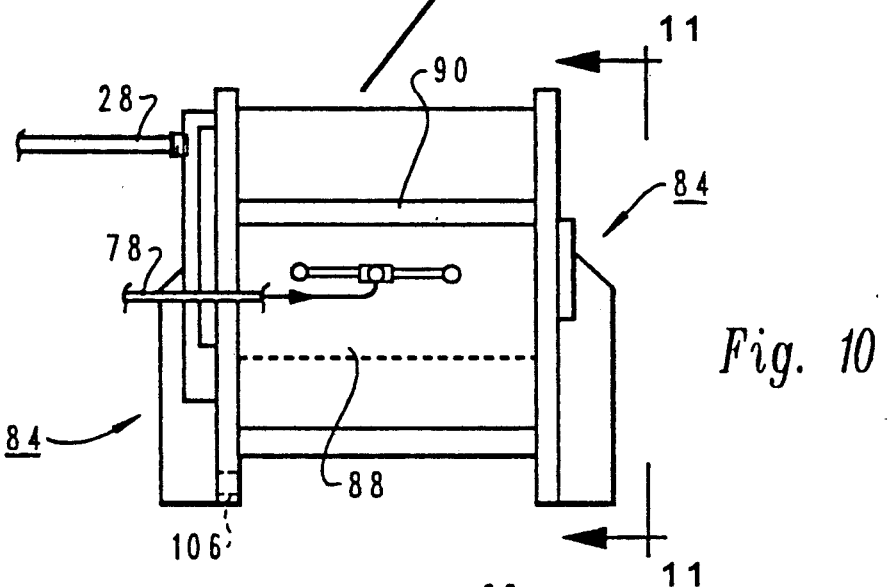
FIG. 10 is an end elevation of the work piece compartment utilized in the apparatus of FIG. 9.
Figure 11:
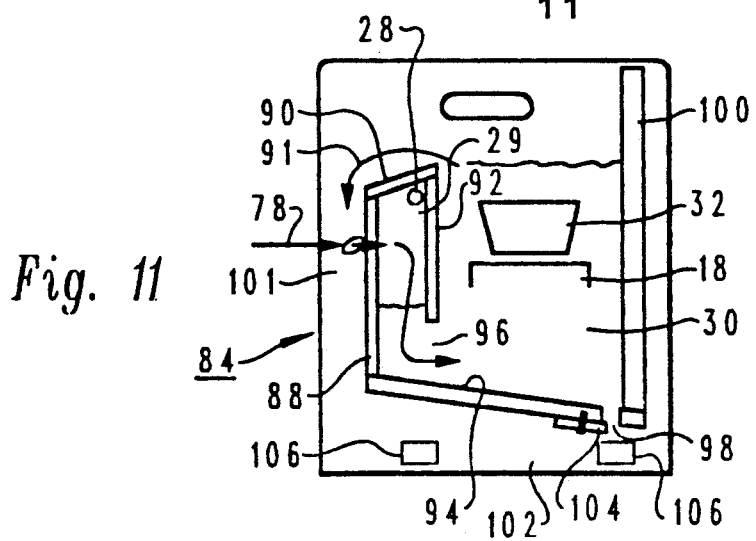
FIG. 11 is an end elevation as seen substantially from the position 11—11 of FIG. 10.

Adapted to be disposed in compartment 74 is a gas piston and inner tank assembly designated 84 as best seen in FIGS. 10 and 11. The inner tank includes a vertical weir box structure 88 internally sealed about its upper portion to enable functioning as a gas piston in the manner described supra. The upper surface 90 is canted in the manner illustrated to provide a weir function down stream for flow 91 passing over the weir from the raised surface level of liquid 30. The front face of the weir box is comprised of a vertically depending wall 92 terminating above downwardly sloped lower flooring 94 so as to define a flow opening 96 therebetween. At the low end of flooring 94 adjacent wall 100 is a longitudinally slotted drain 98 communicating with sump 102 beneath the flooring 94.

Insofar as this embodiment incorporates a gas piston within the interior upper end of box 88, its operation is similar to that described supra whereby operating gas 29 is introduced via conduit 28 to the upper interior of weir box 88. This causes the fluid level of the process liquid 30 within the weir box to fall while simultaneously causing the level of process liquid in and about tray 32 to rise to at or above the upper edge of weir plate 90 in an overflow relation. Exhausting gas 29 reverses direction of the liquid levels until equalized.

The weir function of upper wall 90 enables the system to purge contamination particles that are light, floating or trapped in surface tension. Being downstream of any residual volume flow, fluid passing near the surface is naturally driven toward the weir until falling into the vertical space 101 behind the weir box and into sump 102. Similarly, drain 98 functions to purge heavy particles or other-forms of contamination from the system as would gravitate along sloping floor 94 to the drain opening 98 and then into sump 102. Recirculation allows other functions such as filtering, temperature control, bubble purging, etc. With recirculating pump 76 being continuously operative, the process fluid within sump 102 is continuously drawn through intake 80 and resupplied via conduit 78. Adjustable cover plate 104 can be preset to vary the size opening of drain 98. Optionally, a portion of the recirculating process fluid can be discarded to a suitable disposal site.

Figure 13:
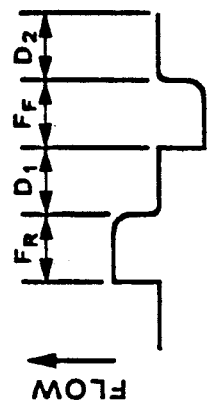
FIG. 13 is a typical operating fluid timing diagram in the operation of the apparatus.
Figure 14:
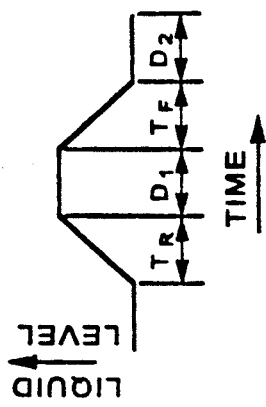
FIG. 14 is a typical process fluid timing diagram in the operation of the apparatus.
Figure 12:
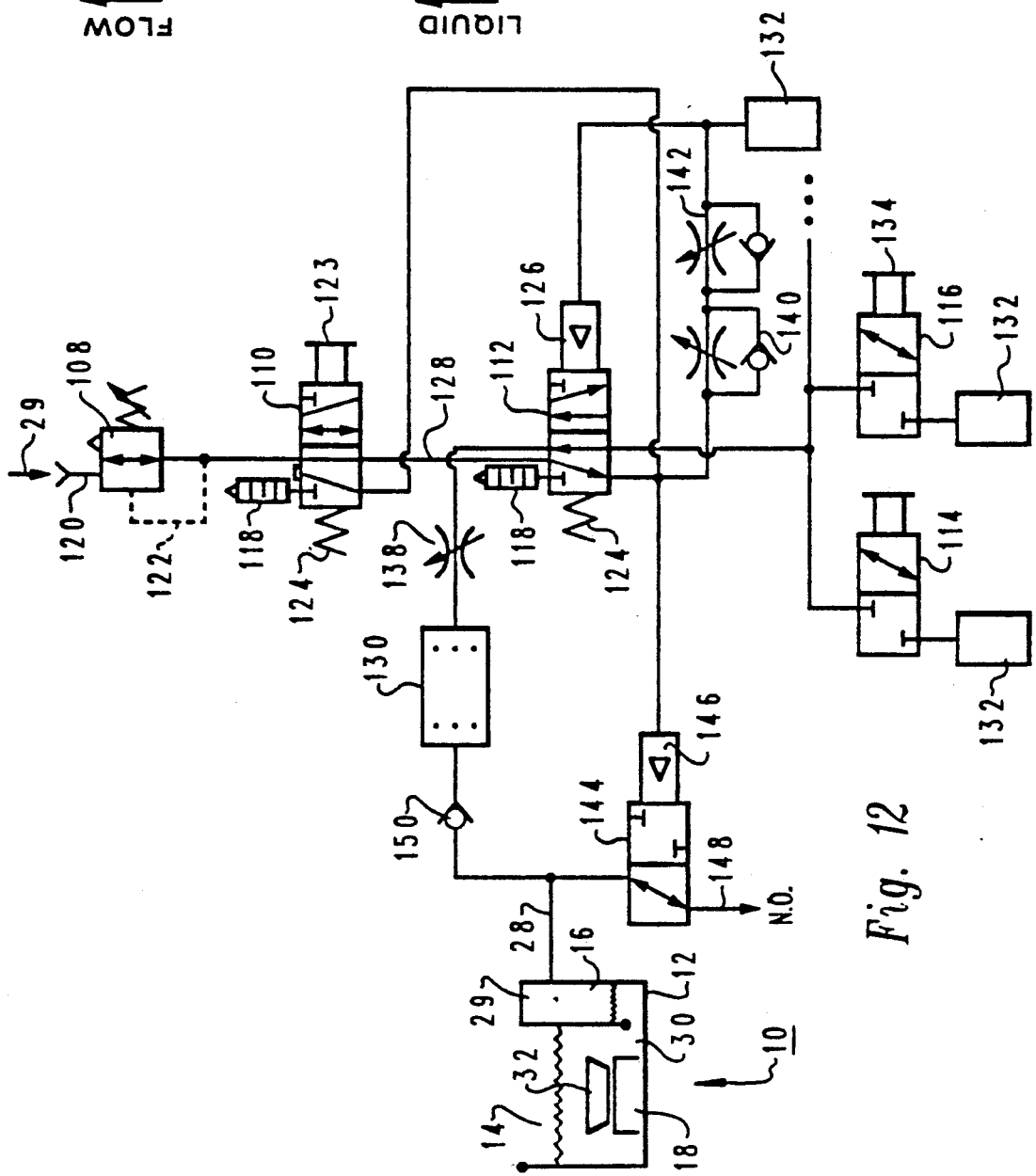
FIG. 12 is a logic circuit for controlling flow of operating fluid by which the process fluid is caused to be agitated.

Control over the rise and fall of the process fluid past the work piece is achieved (except for the embodiment of FIG. 8) by means of the pneumatic logic circuit illustrated in FIG. 12. The logic will now be described in conjunction with the timing diagrams of FIGS. 13 and 14 on which the following abbreviations are utilized:

FR = Flow Rise
FF = Flow Fall
D1 = Dwell Time 1
D2 = Dwell Time 2
TR = Rise Time
TF = Fall Time In operation of the logic circuit, commercially available components are utilized. A source of pressurized operating fluid 29 is connected to the inlet 120 of flow regulator 108. The regulator may optionally include a self relieving feature 122. From the regulator, flow passes to an on/off switch 110 in which each of the two 3-way valves of the 4-way valve is used as a 2-way valve. While the right-most valve functions in a system on/off manner, the left-most valve operating oppositely in phase functions in a logic vent manner. When the manual switch on valve 110 turns the system off, the logic is simultaneously vented. With the logic vent, the 4-way valve 112 is restored to its normal state by its metal spring 124 while 2-way valve 144 is returned to its normally open state by its metal spring (not shown). Neither valve can mid-shift. When final exhaust valve 144 opens, the gas piston exhausts compartment 16 causing the liquid levels in the gas cylinder and in the process tank to relax and equalize.

When the system is turned on, the 4-way valve 112 feeds pressure to the timing circuit and to valve 144 which closes immediately so that the air cylinder can be pressurized in rise time TR. Flow control valve 140, which controls the uptime of process fluid 29, is adjusted to raise the pressure in reservoir 132 at air pilot 126 to its trigger pressure in the desired rise time TR plus dwell time D1. Trigger pressure shifts valve 112 so that timing and valve 144 are vented through muffler 118. Valve 144 opens immediately and vents the cylinder in fall time TF. Flow control 142, which controls the downtime of process fluid 29, is adjusted to reduce the pressure in reservoir 132 and at the air pilot 126 to below its spring return pressure in the desired fall time TF plus dwell time D2. The cycle then repeats. Via adjustments to control valves 140 and 142, system timing can be readily varied to suit.

During rise time TR plus dwell time D1, the reservoirs 132, manually preselected by valves 114, 116, are dumped by valve 112 toward the air cylinder 16 in the tank 12. This involves flow control 138, functioning to control air shock, filter 130, check valve 150, and conduit 28. The cylinder 16 is pressurized by operating fluid 29 in its natural rise time TR unless slowed by flow control 138 whereby fluid 29 causes the process fluid 30 to rise in the manner described supra. Manually preselecting the reservoirs by presetting valves 114, 116 open or closed, governs the volume of gas 29 delivered to cylinder 26 for varying the stroke length to suit.

During fall time TF plus dwell time D2, the reservoirs 132 are repressurized by valve 112. The cylinder 16 is vented in its natural fall time causing the process fluid liquid in compartment 14 to fall. Rise time TR and fall time TF are determined by circuit parameters such as tubing size and length. If the flow controls are set for longer times, dwell times appear. Dwell time may be useful and convenient in some applications.

Only a small portion of the pressurized operating fluid 29 used to operate the logic in the control unit is unavailable for the operating function. This typically represents one percent to three percent of the total volume and can if desired be returned to the volume displacing function of the gas piston. The latter requires a circuit modification in which nearly all the pressurized fluid 29 is utilized to displace process fluid. As shown, the small fraction is vented within the control unit to provide a small purge function in the event the control unit is located in a corrosive or damaging ambient.

Via the reservoirs and the 4-way valve 112, the operating gas 29 passes through a flow control 138 which can be adjusted to limit the flow at the beginning of each displacement stroke of the gas piston. By adjusting the flow in this manner, the possibility of shock to the structure or to the work piece in tray 32 is minimized. Filter 130 removes contaminants in a well known manner that might otherwise be entrained in the gas 29 and ultimately pass into the process fluid 30. Check valve 150 prevents chemical fumes from diffusing upstream and thereby precludes damage to the various circuit components. Needless to say, piping and components otherwise potentially exposed to chemicals and fumes from the process fluid must be of a composition selected so as not to be deleteriously affected thereby.

The ability to select stroke displacement makes the control unit adaptable not only to different process modes but also to different tank sizes and geometries The operating cycle including altering the liquid levels and restoring the liquid levels to equilibrium typically varies between one and ten seconds. The stroke typically varies between five percent and twenty-five percent of liquid depth and both can be adjusted to suit.

By the above description there is disclosed novel method and apparatus for agitating a process fluid whereby to continually present fresh process fluid into contact with a work piece subject to being processed thereby. Whereas similar purpose processes previously utilized may have relied on agitation of the process fluid via turbulence, the system hereof relies on laminar flow during the rise and fall of the liquid process fluid. When the process fluid is comprised of a gas it can be subject to displacement or compression and decompression in effecting the laminar flow. Being a volume reaction rather than a surface reaction, the oscillating flow can treat all exposed surfaces of the work piece. The duration of dwell times relative to flow times can affect the rate of reaction on flat surfaces relative to exposed sidewalls.

Intermittent microscopic effect of laminar flow as utilized herein achieves macroscopic agitated stirring in the larger volume of the free stream. Though not completely understood, it is believed that during flow, boundary layers along the surface of the work piece represent a reacting reality. Such boundary layers function to insulate the surface from the chemistry of the free stream and diffusion becomes more limited cross the boundary layers than across an equal volume of the free stream. As a consequence, small quiescent reaction chambers are created that are "fresh" for a short time period and then repeat.

When the flow stops and then reverses, the boundary layer of laminar flow gets thinner and disappears. This occurs simultaneously over all surfaces while uniformly evacuating the accumulated reaction products and delivering fresh reactants to the vicinity of all surfaces. During flow, reaction is occurring within the boundary layers in which some limited diffusion is occurring across the layers. When flow stops and the boundary layers collapse, diffusion between the replenished large volume and the reacting surface is no longer insulated or frustrated but occurs freely with only the thickness distance of the previous boundary layer to traverse.

Restarting flow causes a thin boundary layer to be reestablished. If sufficient dwell time is allowed for diffusion across the short distance of the previous boundary layer, a new boundary layer is established with a composition of fresh reactant chemicals. Since diffusion across the boundary layer is significantly less than across an equivalent volume of stagnant fluid, reaction of the boundary layer with the solid surface proceeds with involvement of essentially only the volume within the boundary layer.

When the boundary layer reactants are depleted, they are again replenished by stopping the flow enabling the collapsing of the boundary layer and allowing sufficient dwell time for diffusion to occur. Since the boundary layer acts as a diffusion insulator, it periodically holds a fixed volume of reactants at the surface.

If the reaction column is quartz such as silicon, ceramic or other composition, high temperature gas reaction can benefit. Operation at low pressure is likely with intermittent or pulsatile flow.

Whether for high or low temperature, for high or low presure, or for high or low flow velocities, intermittent or pulsatile flow effecting successive unidirectional displacement, not in oscillation, may be as effective as the ebb and flow of the oscillating motion described supra.

The apparatus for performing the method hereof represents the height of simplicity in requiring only two basic functional parts comprising a control unit and a tank unit either of which can be utilized in a variety of different formats. In its purest form, the apparatus operates without moving parts in the process region and does not cause displacement of the work piece in the course of processing By means of a controlled piston action utilizing an operating fluid of either a gas or liquid, the liquid level in and about the work piece can be caused to rise and fall in a controlled manner with a laminar flow. During a controlled cycle, the effect of the piston action is to achieve a height differential "A" (FIG. 3) regarded as optimum, for a selected application. In this manner, the ebb and flow of the tidal motion can be equivalent to a much greater controlled flow than can for example, be produced controllably by a recirculating pump.

Via the control unit, adjustments are afforded for varying the time for each half cycle corresponding to the raising and lowering of the fluid level. Another adjustment controls dwell time between cycles whereas further adjustments are available to control the volume of fluid displacement in the ultimate height differential sought to be achieved. Once preset, the apparatus relieves an operator from the burden of manually producing fluid or product agitation motion. It also obviates the hazard of repetitive motion injuries, principally carpal tunnel syndrome. The operator and other moving parts are also removed from the process site and are thus not available to produce particles or contamination that might adversely affect the process.

Whereas pneumatic logic has been disclosed herein, it is contemplated that other logic such as hydraulic, electropneumatic pneumatic - hydraulic, electronic, etc could be readily adapted to suit. Moreover, whereas a pneumatic piston or hydraulic flow has been described and generally preferred depending on the embodiment selected, other variations could be substituted therefor. That is, a bladder or balloon could be utilized in either the control unit or in a gas piston; a solid plunger could be utilized to increase and decrease the displacement and the fluid level; oscillating motion and the use of vanes could be utilized to produce a preferred flow pattern; a bellows could be utilized; a cascade system consisting of staged oscillating overflow could be resorted to; a refluxer could be utilized to oscillate in a variety of different arrangements; etc.

Since the agitation system hereof is a non-harmonic oscillator it may be slightly underdamped, critically damped, or overdamped without ringing at either the maximum or minimum height of the process fluid. The system will be most efficient when driven near its resonant frequency. As stated supra, a typical cycle extends between 1 and 10 seconds although some photographic processes, for example, may benefit from a more gentle cycle of up to 30 seconds.

By comparison with a prior art system utilizing a circulating pump and achieving one-half tank volume change per minute, the system hereof achieves much higher equivalent flows. That is, with each rise and fall of the liquid representing about twenty percent tank volume per cycle, every fifth cycle is equivalent to one tank volume. At twenty cycles per minute this amounts to four volume changes per minute and can if desired achieve as many as ten equivalent tank changes per minute. Yet the oscillating flow is even, controlled, and contained affording a calm surface indicative of the substantial absence of turbulence. With the available flow being several times as great as previously practical, there is provided a greater and more even utilization of the process fluid to accomplish the intended result on the work piece.

Whereas the invention has been described with specific regard to the reaction between a process fluid and a work piece, it is not intended to be limited thereto. Rather, it is contemplated that the invention could be readily utilized to achieve a reaction between two or more fluids. The fluids could be liquid, gas or a combination thereof.

Since many changes could be made in the above construction and many apparently widely different embodiments of this invention could be made without departing from the scope thereof, it is intended that all matter contained in the drawings and specification shall be interpreted as illustrative and not in a limiting sense.

I claim:

1. Apparatus for processing a work piece in a process fluid comprising:
   a tank adapted to contain a process fluid in which a work piece is to be supported; and
   logic disposed entirely in a contaminant-free relation to the process fluid in said tank and operative to controllably displace the process fluid successively in a substantially laminar flow relation past the work piece.

2. Apparatus in accordance with claim 1 in which said logic includes an adjuster to enable presettable adjustment of the fluid displacement stroke effected by said logic.

3. Apparatus in accordance with claim 1 in which said logic includes an adjuster to enable presettable adjustment of the fluid displacement rate effected by said logic.

4. Apparatus in accordance with claim 1 in which said process fluid comprises a liquid, said successive displacement comprises oscillation and said logic is operative to alternately raise and lower the level of said process liquid relative to a work piece immersed therein.

5. Apparatus in accordance with claim 4 in which said logic is operative to controllably admit and remove additional quantities of said process liquid to the process liquid in said tank for varying the process liquid level relative to the immersed work piece.

6. Apparatus in accordance with claim 4 in which said tank is divided between at least two compartments in flow communication with each other with one of said compartments being adapted to receive the work piece immersed in the process liquid and there is included mechanical means operative to displace the fluid level in the other of said compartments to effect the rise and fall of the liquid level in said one compartment.

7. Apparatus in accordance with claim 1 in which said process fluid comprises a gas, said process compartment is sealed about the process level of the work piece, there in included a displacement liquid exposed to said gas and said logic is operative to displace said displacement liquid for displacing said gas in said laminar relation.

8. Apparatus in accordance with claim 1 in which said logic is entirely located external of said tank.

9. Apparatus in accordance with claim 1 in which said successive fluid displacement effected by said logic is characterized as being pulsatile and said logic includes control means to effect said pulsatile flow.

10. Apparatus for processing at least two process fluids for effecting a reaction therebeween comprising:
a tank adapted to contain a quantity of each process fluid to be reacted; and
logic disposed entirely in a contaminant - free relation to the process fluids in said tank and operative to controllably displace the process fluids successively in a substantially laminar flow relation.

11. Apparatus for processing a work piece in a process fluid comprising:
a tank adapted to contain a process liquid in which a work piece is to be supported; said tank being divided between at least two compartments in flow communication with each other, one of said compartments being relatively isolated and extending in a space sealed relation above the liquid level therein and the other of said compartments containing said work piece disposed in said liquid; and
logic operative to controllably admit and remove an externally supplied high pressure operating fluid to the space relation within said one compartment for respectively effecting a successive oscillating rise and fall displacement cycle of the level of the process liquid in the other of said compartments in a substantially laminar flow relation past the work piece disposed therein.

12. Apparatus in accordance with claim 11 in which said operating fluid comprises a gas and said logic communicates said gas to within the space relation to said one compartment above the liquid level therein in an air piston relation.

13. Apparatus in accordance with claim 11 in which said tank includes a weir positioned in said other compartment at the raised level of said process liquid and in communication downstream with a sump for contaminants to flow from the high level of said process liquid over said weir and to said sump and there is included a recirculating pump for maintaining a flow of said process liquid into said tank.

14. Apparatus in accordance with claim 13 including a bottom drain below said weir in communication with said sump and through which to capture heavy particles near the bottom of said other compartment.

15. Apparatus in accordance with claim 13 including discard means to discard a predetermined portion of said flow from the recirculation effected by said pump.

16. Apparatus according to claim 15 including makeup means for supplying fresh liquid to said flow in quantities corresponding to the quantity of flow discarded by said discard means.

17. Apparatus in accordance with claim 11 in which said logic includes an adjuster to enable the presettable adjustment of the fluid displacement stroke effected by said logic.

18. Apparatus in accordance with claim 11 in which said logic includes an adjuster to enable presettable adjustment of the fluid displacement rate effected by said logic.

19. Apparatus in accordance with claim 11 in which said logic includes adjuster means to enable presettable adjustment of dwell time in the displacement cycle of said liquid.

20. Apparatus in accordance with claim 11 in which said successive fluid displacement effected by said logic is characterized as being pulsatile and said logic includes control means to effect said pulsatile flow.

21. Apparatus in accordance with claim 11 in which said tank includes a weir positioned in said other compartment at the raised level of said process liquid and in communication downstream with an outlet for contaminants to flow from the high level of said process liquid over said weir and to said outlet and there is included a source of process fluid for supplying a flow of said process liquid into said tank.

22. Apparatus in accordance with claim 21 including a bottom drain below said weir in communication with said outlet and through which to capture heavy contaminants near a relatively lower level of said compartments.

23. Apparatus in accordance with claim 21 including discard means to discard a predetermined portion of process fluid from said tank.

24. Apparatus according to claim 23 including makeup means for supplying fresh process liquid to said flow in quantities corresponding to the quantity of flow discarded by said discard means.

* * * * *